(12) United States Patent
Thiagarajan et al.

(10) Patent No.: US 12,439,824 B2
(45) Date of Patent: Oct. 7, 2025

(54) DIFFUSION BONDING OF PIEZOELECTRIC CRYSTAL TO METAL WEAR PLATE

(71) Applicant: SECRETARY, DEPARTMENT OF ATOMIC ENERGY, Mumbai (IN)

(72) Inventors: Gnanasekaran Thiagarajan, Kalpakkam (IN); Lakshmi Gandhan I.Ilango, Kalpakkam (IN); Asokane Cannessane, Kalpakkam (IN); Jeyan Ramamurthy Mattamanna, Kalpakkam (IN); Saju Thomas Abraham, Kalpakkam (IN)

(73) Assignee: Secretary, Department of Atomic Energy, Mumbai (IN)

( * ) Notice: Subject to any disclaimer, the term of this patent is extended or adjusted under 35 U.S.C. 154(b) by 1066 days.

(21) Appl. No.: 17/436,963

(22) PCT Filed: Mar. 23, 2019

(86) PCT No.: PCT/IB2019/052373
§ 371 (c)(1),
(2) Date: Sep. 7, 2021

(87) PCT Pub. No.: WO2020/194026
PCT Pub. Date: Oct. 1, 2020

(65) Prior Publication Data
US 2022/0173305 A1 Jun. 2, 2022

(51) Int. Cl.
*H10N 30/073* (2023.01)
*H10N 30/06* (2023.01)
(Continued)

(52) U.S. Cl.
CPC ........... *H10N 30/073* (2023.02); *H10N 30/06* (2023.02); *H10N 30/877* (2023.02); *H10N 30/88* (2023.02)

(58) Field of Classification Search
CPC .... H10N 30/073; H10N 30/06; H10N 30/877; H10N 30/88
See application file for complete search history.

(56) References Cited

U.S. PATENT DOCUMENTS 3,590,467 A 7/1971 Chase et al.
3,897,628 A * 8/1975 Hanak ............... H10N 30/06
29/25.35
(Continued)

FOREIGN PATENT DOCUMENTS

EP 1204153 A2 5/2002
FR 2079836 A5 11/1971
(Continued)

OTHER PUBLICATIONS

Du et.al., Chemical mechanical polishing of nickel for applications in MEMS devices, Microelectronic Engg., 755, 2, p. 23-241, Aug. 2004 (Year: 2004).*
(Continued)

*Primary Examiner* — Jeffrey T Carley
*Assistant Examiner* — Jose K Abraham
(74) *Attorney, Agent, or Firm* — The Dobrusin Law Firm, P.C.

(57) ABSTRACT

The disclosed method of diffusion bonding of a lead zirconate titanate piezoelectric crystal to a metal wear plate, for the fabrication of an ultrasonic transducer operable at high temperatures and able to withstand repeated thermal cycling, comprises depositing noble metal coatings on both bonding surfaces, bringing the surfaces into contact, and heating under pressure at a temperature ranging from 270 to 400° C.

8 Claims, 1 Drawing Sheet

(51) Int. Cl.
*H10N 30/87* (2023.01)
*H10N 30/88* (2023.01)

(56) References Cited

U.S. PATENT DOCUMENTS

| | | | | |
|---|---|---|---|---|
| 4,077,558 | A | * | 3/1978 | Carlson ............... H10N 30/073 228/121 |
| 4,582,240 | A | | 4/1986 | Lux et al. |
| 4,769,882 | A | * | 9/1988 | Rosen ................... H10N 30/06 29/25.35 |
| 4,921,415 | A | | 5/1990 | Thomas, III et al. |
| 5,196,756 | A | | 3/1993 | Kohno et al. |
| 5,325,012 | A | | 6/1994 | Sato et al. |
| 5,465,897 | A | | 11/1995 | Dixon et al. |
| 6,188,162 | B1 | * | 2/2001 | Vennerbeck ............. B08B 3/12 310/334 |
| 2011/0012478 | A1 | * | 1/2011 | Najafi ................... H01L 24/82 156/60 |
| 2017/0128983 | A1 | * | 5/2017 | Horsley ............... H10N 30/875 |
| 2018/0123017 | A1 | * | 5/2018 | Fujii ................... H10N 30/8554 |
| 2019/0245515 | A1 | * | 8/2019 | Hurwitz ................ H03H 9/173 |

FOREIGN PATENT DOCUMENTS

| | | | |
|---|---|---|---|
| GB | 1526950 A | 10/1976 | |
| GB | 2495378 A | 4/2013 | |
| JP | 2013021176 A | * 1/2013 | ......... H01L 41/0478 |
| WO | WO-2013008781 A1 | * 1/2013 | ............ H10N 30/06 |

OTHER PUBLICATIONS

Yerganian S S: "Ceramic Element Bonding for Piezoelectric Motors", Topical report KCP-613-6342, Honeywell, Jun. 2000 (Jun. 2000), pp. 1-23, XP055652453, Retrieved from Internet: URL:www.osti.gov/servlets/purl/756503 [retrieved on Dec. 12, 2019].
PCT International Search Report & Written Opinion dated Jan. 7, 2020, Application No. PCT/IB2019/052373.
Griffin J W et al: "Under-Sodium Viewing: A Review of Ultrasonic Imaging Technology for Liquid Metal Fast Reactors", U.S. Department of Energy Report PNNL-18292, Mar. 2009.
R.Kazys; A. Voleisis; B. Voleisiene, High Temperature Ultrasonic Transducers: review, Ultragaras (Ultrasound, (200800000), vol. 63, pp. 7-17.
PCT International Preliminary Report on Patentability dated Sep. 6, 2021, Application No. PCT/IB2019/052373.

* cited by examiner

DIFFUSION BONDING OF PIEZOELECTRIC CRYSTAL TO METAL WEAR PLATE

FIELD OF INVENTION

The present invention relates to a method of diffusion bonding of piezoelectric crystal to a metal wear plate. Particularly, the present invention relates to a method of diffusion bonding of lead-zirconate titanate piezoelectric crystals to a metal wear plate for the fabrication of a high temperature ultrasonic transducer.

BACKGROUND OF THE INVENTION

A transducer is any device that converts one form of energy to another. An ultrasonic transducer converts electrical energy to mechanical energy in the form of sound and vice versa. Piezoelectric ultrasonic transducer assemblies generally comprise a piezoelectric element such as a slab or a wafer of a piezoelectric crystal which is mounted on a metal wear plate and contacted by one or more electrodes. The piezoelectric element converts electrical energy into ultrasonic energy. The wear plate protects the piezoelectric element from the testing environment. The metal wear plate may be the base of a housing which encloses the piezoelectric element. The base serves generally to couple acoustic energy between the piezoelectric transducer element and an object or material in contact with the base. For efficient acoustic coupling, the transducer element and the metal wear plate must be in intimate contact with one another, and it is common to bond the transducer element directly to the base.

High temperature ultrasonic transducers are in high demand in modern science and technology. Fabrication of high temperature ultrasonic transducers has application in energy generating systems using liquid metals as coolants. These transducers find application in industries that handle high temperature fluids such as molten metals and salts.

Conventional ultrasonic transducers can tolerate temperatures up to approximately 50° C. At higher temperatures they will eventually suffer permanent damage due to internal disbonding caused by a thermal expansion mismatch. Therefore, commercial ultrasonic transducers show poor performance at elevated temperatures due to inability to withstand prolonged exposure to high temperature and undergo repeated thermal cycling.

The two major requirements for ultrasonic measurements at high temperatures are: to possess transducers that themselves withstand the high temperatures and to also to provide a suitable acoustic coupling between the sensitive element of the transducer viz. piezoelectric crystal and the metallic component in the transducer. Design of a high temperature ultrasonic transducers depends on the selection of the piezoelectric element as well as the bonding method to bond the piezoelectric element to the metallic wear plate in the transducer.

In the past, the techniques used to bond the piezoelectric crystal (having pre-coated electrodes) of an ultrasonic transducer to the metallic wear plates (separating the transducer from liquid metals) include the following:

(1) by placing the piezoelectric crystal over a highly polished surface of the metallic wear plate with a foil of a soft metal such as high purity gold in between and keeping them mechanically compressed
(2) by using greases and epoxy sealants between the wear plate and the crystal
(3) by soldering the wear plate to the pre-coated electrode on the crystal:

U.S. Pat. No. 3,590,467, UK patent 1,526,950 and U.S. Pat. No. 5,325,012 is directed to bonding piezoelectric elements to metallic components by soldering.

However greases and epoxy sealants degrade during operation at high temperatures. Mechanical compression bonds also lose their characteristics at high temperatures. This phenomenon results in loss of acoustic bonding of the piezoelectric crystal to the metal wear plate and failure of the transducer actions. Commonly used solders have low melting point thus limiting the maximum temperature of operation of the ultrasonic transducer. The use of high temperature solders is a possibility, however their brittle nature and also due to the formation of brittle intermetallic compounds with the alloying components of the wear plate, the acoustic bonding is lost during thermal cycling.

Diffusion bonding is a solid-state bonding technique wherein, a metallurgical bond is formed by heating and pressing two similar or dissimilar surfaces together establishing interatomic bonds across the interface. The International Welding Institute (IWI) adopted a definition as proposed by N. F. Kazakov:

"Diffusion bonding of materials in solid state is a process for making a monolithic joint through formation of bonds at atomic level as a result of closure of the mating surfaces due to local plastic deformation at elevated temperature which aids the inter-diffusion at the surface layers of the materials being joined."

In diffusion bonding, diffusion across and along the interface is essential to form a metallurgical bond between the specimens. In order for the diffusion to occur, the interfaces must be in contact and the atoms must have enough energy to cause mass transport across and along the interface. The requirements can be met by application of pressure which increases surface to surface contact and by increasing the bonding temperature which raises the atomic mobility.

There are known some attempts of diffusion bonding of a piezoelectric element.

French patent FR 2079836 is directed to silver ceramic/metal seal—for ultrasonic transducers operating in liquid sodium and refers to bonding $LiNbO_3$ using silver nanoparticles (applied in the form of a commercial silver paste) to metallic component under pressure in inert gas ambient at 800° C. for 48 h. This method uses inert gas during diffusion bonding. Bonding temperature of 800° C. is applicable to $LiNO_3$ (oxygen loss is imminent for $LiNbO_3$ at these temperatures). But this method cannot be used for Lead-zirconate titanate (PZT) crystal, which is commonly used ferroelectric ceramic and has desirable piezoelectric properties. Use of inert gas can also lead to entrainment of gaseous bubbles during diffusion bonding if the surface finish is not adequate.

U.S. Pat. No. 4,582,240 is directed to a method for low temperature, low pressure diffusion bonding of piezoelectric ceramic crystals, wherein ceramic pieces with fired-on silver electrodes are stacked with a thin shim of solid indium alloy therebetween. The indium alloy preferably comprises 25% indium, 37.5% lead and 37.5% tin. The stack is placed under 150 psi compression and heated at a temperature of about 350° for 30-48 hours in an inert gas. During bonding process, the low melting alloy melts and dissolves silver till saturation. Solder alloy components diffuse into silver electrodes and disc and form intermetallic compounds that provides the strength of the metallurgical bond. However use of inert gas can lead to entrainment of gaseous bubbles during diffusion bonding if the surface finish is not adequate.

U.S. Pat. No. 4,921,415 is directed to a high temperature ultrasonic transducer assembly comprising a lithium niobate piezoelectric element having anisotropic coefficients of thermal expansion which is mounted on a metal base of the transducer assembly by means of a layer of structured copper. The structured copper is thermo-compression diffusion bonded to the lithium niobate element and to the metal base, and is compliant in a transverse direction to compensate for differential thermal expansions. The said piezoelectric ultrasonic transducer assembly is useful at high temperatures of 350° C.

EP 1204153A2 discloses bonding of piezoelectric element to an electrode by coating the two bonding surfaces with elements chosen from Au, Al, Zn, Cu and Sn. They are heated to 290° C. under a given load of 7.28 kg (dimensions of the bonding surface not mentioned and hence the applied pressure during bonding cannot be calculated) for 90 seconds. The patent also mentions about soldering the surfaces. Piezoelectric material is not specified.

Kazys et. al reports the diffusion bonding of bismuth titanate piezoelectric material with gold interlayer [R. Kazys, A. Voleisis, B. Voleisiene, *High temperature ultrasonic transducers: review, Ultragarsas (Ultrasound)* 63 (2008) 7-17]. However exact conditions of bonding are not disclosed in the literature.

U.S. Pat. No. 5,196,756 discloses the method to construct a stack-type piezoelectric element comprising plural layers of sintered piezoelectric ceramic material of PZT. Electrodes which lie between the PZT discs bond the respective layers of the piezoelectric ceramic material by diffusion. The electrode materials are either aluminum or nickel based. In both the systems, a three layer electrode is used. In case of aluminum based electrode, the first and third layers which face the bottom and top PZT ceramics is Al—Si alloy. The second layer which lies between the two Al—Si alloy layers is made of pure Al. The bonding is carried out at a temperature between 580 and 660° C. under a small applied load. While bonding, the low melting Al—Si alloy bonds with the ceramic and the Al layer in between remains solid. In case of nickel based system, pure Ni and an alloy/compound of Ni with Cr and/or phosphorous form the electrodes. The bonding is carried out at a temperature between 875 and 1200° C. It is to be pointed out that the process describes methods to bond PZT discs together and does not disclose method to bond PZT to a metallic wear plate. Also there is no disclosure regarding the thermal cyclability.

U.S. Pat. No. 5,465,897 discloses an ultrasonic transducer which is formed as a diffusion bonded assembly of piezoelectric crystal, backing material, and, optionally, a ceramic wear surface. The mating surfaces of each component are silver films that are diffusion bonded together under the application of pressure and heat. Each mating surface may also be coated with a reactive metal, such as hafnium, to increase the adhesion of the silver films to the component surfaces. Only thin silver films are deposited, e.g., a thickness of about 0.00635 mm, to form a substantially non-compliant bond between surfaces. The commercial piezoelectric crystal may be lead zirconium titanate (PZT), lithium niobate, or the like, is provided with gold-backed or Cr/Au surfaces. Prior to bonding, silver is coated on these surfaces. The silver coated surfaces are stacked facing each other and heated to 200 to 250° C. under a pressure of 20 to 30 ksi (140 to 200 MPa) for 10 to 15 minutes. However, this process discloses the bonding of PZT to ceramic wear plates only. Also there is no disclosure regarding the high-temperature operation and its thermal cyclability.

Yerganian et.al reports PZT to PZT, and PZT to metal bonding for piezoelectric motors using silver interlayer at the bonding temperature of 200° C. and pressures ranging from 40 to 200 kPa. [Yerganian S. S. *Ceramic element bonding for piezoelectric motors. Honeywel. Topical report.* KCP-613-6342. 2000. P. 1-23.]. The metallic part used is stainless steel. Further, there is no disclosure regarding the high-temperature operation and its thermal cyclability.

Griffin et. al refers to a transducer for use in fast breeder test reactor which is a single-element, scanning device using PZT-5A or lead metaniobate transducer material developed at IGCAR. The transducer is 20 mm in diameter and operates at 2 MHz. A polished nickel diaphragm interfaces the transducer to the molten sodium. The silver coated surface of PZT was soldered to the nickel wear plate using a commercial lead-tin solder alloy. Operating temperature is nominally 180° C. [J. W. Griffin, L. J. Bond, T. J. Peters, K. M. Denslow, G. J. Posakony, S. H. Sheen, H. T. Chien, A. C. Raptis, *Under-Sodium Viewing: A Review of Ultrasonic Imaging Technology for Liquid Metal Fast Reactors*, USAEC Report PNNL-18292 (March 2009)]. High temperature grease was used for bonding the crystal to metallic nickel. Greases degrade with time and become porous after prolonged exposures at high temperatures.

There is a long felt need to develop an ultrasonic transducer that can operate at high temperature and withstand thermal cycling. The present inventors have developed a method of diffusion bonding of lead zirconate-titanate piezoelectric crystal to a metal wear plate for fabrication of a high temperature ultrasonic transducer which ameliorates the aforesaid shortcomings of the prior art.

Objects of the Invention

It is an object of the present invention to provide a method of diffusion bonding of lead zirconate-titanate piezoelectric crystal to a metal wear plate.

It is another object of the present invention to provide a method of diffusion bonding of lead zirconate-titanate piezoelectric crystal to a metal wear plate for fabrication of a high temperature ultrasonic transducer.

It is another object of the present invention to provide a method of diffusion bonding of lead zirconate-titanate piezoelectric crystal to a metal wear plate to obtain a ultrasonic transducer which enables high temperature operation and withstands thermal cycling.

It is another object of the present invention to provide a method of diffusion bonding of lead zirconate-titanate piezoelectric crystal to a metal wear plate which is a clean and reproducible process, environmentally safe.

It is another object of the present invention to provide a method of diffusion bonding of lead zirconate-titanate piezoelectric crystal to a metal wear plate to obtain a high temperature ultrasonic transducer which is stable up to 250° C.

It is another object of the present invention to provide a method of diffusion bonding of lead zirconate-titanate piezoelectric crystal to a metal wear plate, wherein the said bond meets the acoustic requirements of an ultrasonic transducer.

It is another object of the present invention to provide a method of diffusion bonding of lead zirconate-titanate piezoelectric crystal to a metal wear plate, which is simple, cheap and economical since no expensive solder, electrodes, or flux are required.

It is another object of the present invention to provide a high temperature ultrasonic transducer assembly comprising a diffusion-bonded lead zirconate-titanate piezoelectric crystal to a metal wear plate using a noble metal interlayer which enables high temperature operation and withstands thermal cycling.

SUMMARY OF THE INVENTION

It is an aspect of the present invention to provide a method of diffusion bonding of a lead zirconate-titanate (PZT) piezoelectric crystal to a metal wear plate for fabrication of a high temperature ultrasonic transducer comprising the steps of:
i. Depositing a first coating of a noble metal on the bonding surface of a PZT crystal;
ii. Depositing a second coating of the noble metal on the bonding surface of a metal wear plate;
iii. Bringing the bonding surfaces of the noble metal coated PZT crystal of step (i) and the bonding surface of the noble metal coated metal wear plate of step (ii) into contact with each other and heating under pressure at a temperature ranging from 270 to 400° C. to form a metallic bond to obtain a lead zirconate-titanate (PZT) piezoelectric crystal diffusion-bonded to the metal wear plate by the noble metal interlayer.

BRIEF DESCRIPTION OF THE DRAWINGS

The above and other aspects, features and advantages of certain exemplary embodiments of the present invention will be more apparent from the following description taken in conjunction with the accompanying drawings wherein.

DETAILED DESCRIPTION OF THE INVENTION

Figure 1:
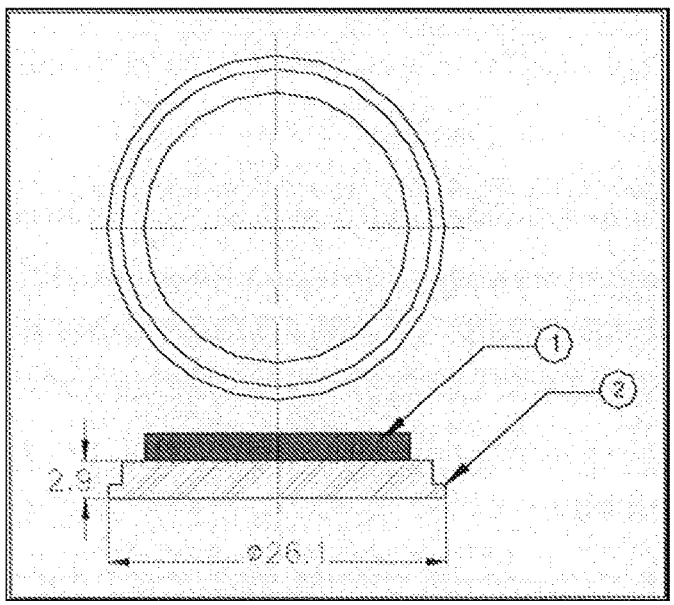
FIG. 1—Magnified cross-section view showing the sequence of assembling of components for diffusion bonding (Reference no 1. PZT crystal with screen printed silver coating Reference no 2. Nickel wear plate with silver coating facing the piezoelectric disc)
FIG. 2—C-scan images of PZT discs diffusion bonded to nickel wear plates at 400° C. (Sample 1 and sample 2) according to the present invention.
 A1, B1 are images of sample 1 and sample 2 respectively obtained after diffusion bonding and before temperature cycling.
 A2, B2 are images of sample 1 and sample 2 respectively obtained after heating to 300° C. followed by cooling to Room temperature (one cycle).
 A3, B3 are images of sample 1 and sample 2 respectively obtained after heating to 300° C. followed by cooling to Room temperature (ten cycles).
 A4, B4 are images of sample 1 and sample 2 respectively obtained after ten temperature cycling and poling

The following description with reference to the accompanying drawings is provided to assist in a comprehensive understanding of exemplary embodiments of the invention. It includes various specific details to assist in that understanding but these are to be regarded as merely exemplary.

Accordingly, those of ordinary skill in the art will recognize that various changes and modifications of the embodiments described herein can be made without departing from the scope of the invention. In addition, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the scope of the invention as defined by the appended claims and their equivalents.

It is to be understood that the singular forms "a," "an," and "the" include plural referents unless the context clearly dictates otherwise.

Features that are described and/or illustrated with respect to one embodiment may be used in the same way or in a similar way in one or more other embodiments and/or in combination with or instead of the features of the other embodiments.

It should be emphasized that the term "comprises/comprising" when used in this specification is taken to specify the presence of stated features, steps or components but does not preclude the presence or addition of one or more other features, steps, components or groups thereof.

The term "Diffusion bonding" as used herein means a solid bonding technique wherein, a metallurgical bond is formed by under pressure a piezoelectric element to a metal wear plate using a noble metal interlayer establishing an interatomic bond across the interface.

The term "high temperature ultrasonic transducer" as used herein means an ultrasonic transducer which can operate over a wide range of high temperature up to 250° C.

The term "wear plate" as used herein means the component of an ultrasonic transducer which protects the piezoelectric element from the testing environment and couples acoustic energy to and from the element. Also sometimes referred to as an interface plate, separating plate, phase plate, coupling plate, front plate, front face, diaphragm, etc. or more generally the support, which in practice may be integrated into a portion of a housing or a part to be inspected, or of a waveguide.

The term "PZT" as used herein means lead zirconate-titanate.

The term "noble metal interlayer" as used herein means a layer of noble metal present between the piezoelectric element and the metal wear plate.

The term "bonding surface" as used herein means the surface of piezoelectric crystal or metal wear plate facing each other for diffusion bonding The present invention provides a method of diffusion bonding of a piezoelectric crystal to a metal wear plate for the fabrication of a high temperature ultrasonic transducer.

"Diffusion bonding" is a solid bonding technique wherein, a metallurgical bond is formed by heating under pressure a piezoelectric ceramic to a metal wear plate using a noble metal interlayer establishing an interatomic bond across the interface. The method of the present invention results in an interatomic bond that is able to withstand a high operation temperature and repeated thermal cycling.

Lead-zirconate titanate (PZT) is a commonly used ferroelectric ceramic which has desirable piezoelectric properties. When fired, PZT has a perovskite crystal structure, each unit of which consists of a small tetravalent metal ion in a lattice of large divalent metal ions. In the case of PZT, the small tetravalent metal ion is usually titanium or zirconium. The large divalent metal ion is usually lead. Under conditions that confer a tetragonal or rhombohedral symmetry on the PZT crystals, each unit lattice of the crystal has a dipole moment.

In particular, the present invention provides a method of diffusion bonding of a lead zirconate-titanate (PZT) piezoelectric crystal to a metal wear plate comprising the steps of:

i. Depositing a first coating of a noble metal on the bonding surface of a PZT crystal;
ii. Depositing a second coating of the noble metal on the bonding surface of a metal wear plate;
iii. Bringing the bonding surfaces of the noble metal coated PZT crystal of step (i) and the bonding surface of the noble metal coated metal wear plate of step (ii) into contact with each other and heating under pressure at a temperature ranging from 270 to 400° C. to form a metallic bond to obtain a lead zirconate-titanate (PZT) piezoelectric crystal diffusion-bonded to the metal wear plate by the noble metal interlayer.

Diffusion bonding of the piezoelectric ceramic component can be carried out at a bonding temperature higher than the maximum operating temperature of the transducer. Diffusion bonding can also be carried out at temperatures above the Curie temperature of the piezoelectric crystal for achieving good bond characteristics. In that case, the bonded crystal assembly can be poled again and used for fabrication of the transducer.

A high temperature for bonding helps a good metallurgical bond to be formed. It is observed that when diffusion bonding is formed at temperatures lower than the maximum operating temperature of the transducer, the bonding fails when the transducer is heated (or exposed to) a temperature above the bonding temperature. Maximum recommended operating temperature of the transducer using PZT having Curie temperature of 380° C. is about 250° C. Hence diffusion bonding has to performed at temperatures above 250° C. In an embodiment of the present invention, the bonding temperature ranges from 270 to 400° C. If bonding is made above 380° C., the crystal loses its piezoelectric property completely. In that case, the PZT crystal has to be repoled and used for fabrication. When bonding is carried out above 400° C., the surfaces of the metallic component may get oxidized which would affect the bonding characteristics.

The interatomic metallic bond produced by the diffusion bonding method of the present invention is able to withstand a prolonged exposure to high temperature and repeated thermal cycling.

In an embodiment of the present invention, lead-zirconate titanate crystal (PZT-SP6) having a Curie temperature of 380° C. and the recommended operation temperatures of up to about 250° C. was diffusion bonded to a metal wear plate at a temperature ranging from 270 to 400° C. by using a noble metal interlayer.

The PZT crystal may be in the form of a disc, sheet, slab or wafer. In an embodiment, the PZT ceramic is in form of a disc.

Suitable noble metal used in the method of the present invention includes silver, gold and the like. In a preferred embodiment, the silver is used as the noble metal interlayer.

The coating thickness of the noble metal deposited on each of the bonding surface ranges from 7 to 35 microns. The total interlayer thickness of the noble metal in lead zirconate-titanate (PZT) piezoelectric ceramic diffusion bonded to the metallic wear plate ranges from 20 to 40 microns.

Suitable metal wear plate used in the method of the present invention includes a wear plate made up of nickel, high nickel alloys and the like. In an embodiment, Nickel is the material of the wear plate chosen for sodium systems.

The bonding pressure of the method of diffusion bonding of present invention ranges from 175 to 225 bar.

The bonding time of the method of diffusion bonding of present invention ranges from 45 minutes to 75 minutes.

In an embodiment, the PZT crystal is pre-coated with electrode before coating in step (i).

In another embodiment, the bonding surface of metal wear plate is polished before coating in step (ii).

In another embodiment, the bonding surface of metal wear plate at step (ii) is polished to mirror finish with planarity of ten microns and roughness of one micron.

In an embodiment, the present invention provides a method of diffusion bonding of a lead zirconate-titanate (PZT) piezoelectric ceramic to a nickel wear plate comprising the steps of:

i. Depositing a first coating of silver on the bonding surface of a PZT crystal;
ii. Depositing a second coating of silver on the bonding surface of a nickel wear plate;
iii. Bringing the bonding surfaces of the silver-coated PZT crystal of step (i) and the bonding surface of the silver-coated nickel wear plate of step (ii) into close contact with each other and heating under pressure at a temperature ranging from 270 to 400° C. to form a metallic bond to obtain a lead zirconate-titanate (PZT) piezoelectric crystal diffusion-bonded to the nickel wear plate by the silver interlayer.

In an embodiment, the present invention provides a high temperature ultrasonic transducer comprising:

a. A lead zirconate-titanate (PZT) piezoelectric crystal with a pre-coated electrode;
b. A metal wear plate;
c. A noble metal interlayer;
Wherein the said lead zirconate-titanate (PZT) piezoelectric crystal with pre-coated electrode is diffusion-bonded to the metal wear plate by the noble metal interlayer.

The ultrasonic transducer of the present invention can be operated at high temperatures of up to 250° C. and also withstand repeated thermal cycling.

Advantages of the present invention are:

The diffusion-bonding method of the present invention provides piezoelectric crystal diffusion bonded to a metal wear plate using a noble metal interlayer which can be used in the fabrication of a high temperature ultrasonic transducer.

The diffusion method of the present invention results in the bonding of the a piezoelectric element to the metal wear plate by a metallic bond that is able to withstand a high operation temperature and repeated thermal cycling.

The interatomic metallic bond meets the acoustic requirements of an ultrasonic transducer and provides efficient acoustic coupling of piezoelectric element with the metal wear plate in the transducer.

The diffusion method of the present invention is a clean and reproducible process, environmentally safe.

The diffusion method of the present invention is cheap and economical since no expensive solder, electrodes, or flux are required.

The high temperature ultrasonic transducers produced according to the method of present invention has application in energy generating systems using liquid metals as coolants, in industries that handle high temperature fluids such as molten metals and salts and the like.

EXAMPLES

The following examples are meant to illustrate the present invention. The examples are presented to exemplify the invention and are not to be considered as limiting the scope of the invention Example-1

Diffusion Bonding of PZT Ceramic to Nickel Wear Plate at 270° C.

The surface of nickel is polished to mirror finish (with planarity and roughness ten microns and one micron respectively). The surface to be bonded to the piezoelectric crystal is then coated with ~5 micron silver and is alloyed with nickel by heating under reducing conditions at 700° C. This ensures a good metallurgical bond between silver and nickel. An additional silver coating of ~2 micron thickness is provided on the silver alloyed nickel surface. Piezoelectric crystal is the PZT-SP6 having approx. 20 micron thick silver electrodes made by screen printing on both sides. One side of the crystal was coated with additional silver coating of ~2 micron thickness. By heating them under vacuum and by applying pressure using a suitable jig, diffusion bonding occurs between the silvered piezoelectric crystal and silver coated nickel wear plate. The nickel wear plate with PZT-SP6 diffusion bonded to it can then be welded to other parts of the transducer by laser welding so as to minimize the heat input.

FIG. 1 illustrates a magnified cross-section view showing the sequence of assembling of components for diffusion bonding (Reference no 1. PZT crystal with screen printed silver coating Reference no. 2. Nickel wear plate with silver coating facing the piezoelectric disc)

Example-2

Diffusion Bonding of PZT Ceramic to Nickel Wear Plate at 400° C.

Diffusion bonding of PZT-SP6 to nickel wear plate was carried out at 400° C. by following the method of Example-1.

Example-3

Characterization of the Diffusion Bonding
A] Ultrasonic c-Scan Imaging
The bond quality was probed by ultrasonic c-scan imaging and was found to be good.
B] Thermal Cycling Data
This assembly after several thermal cycling between 250° C. and room temperature retained the bond qualities.

Figure 2:
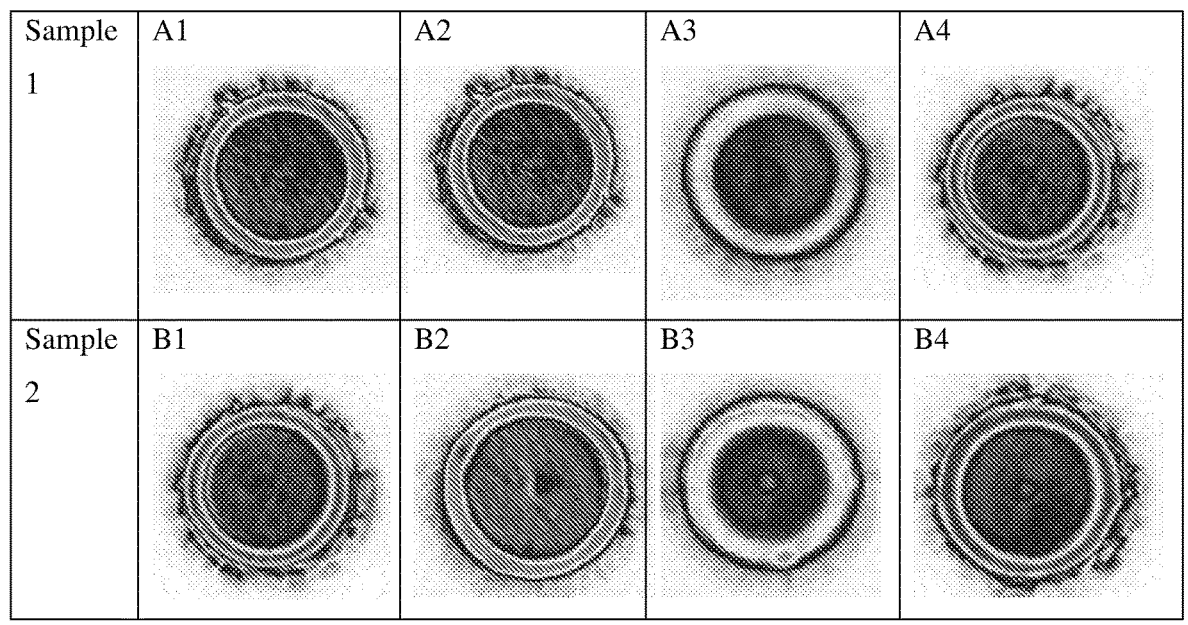

FIG. 2 illustrates the C-scan images of PZT discs diffusion bonded to nickel wear plates at 400° C. (Sample 1 and sample 2) according to the present invention.
A1, B1 are images of sample 1 and sample 2 respectively obtained after diffusion bonding and before temperature cycling.
A2, B2 are images of sample 1 and sample 2 respectively obtained after heating to 300° C. followed by cooling to Room temperature (one cycle).
A3, B3 are images of sample 1 and sample 2 respectively obtained after heating to 300° C. followed by cooling to Room temperature (ten cycles).
A4, B4 are images of sample 1 and sample 2 respectively obtained after ten temperature cycling and poling.

It is clearly observed that the diffusion bonding method of the present invention results in bonding of the piezoelectric element to the metal wear plate by a metallic bond that is able to withstand a high operation temperature and repeated thermal cycling.

It is to be understood that the present invention is susceptible to modifications, changes and adaptations by those skilled in the art. Such modifications, changes, adaptations are intended to be within the scope of the present invention.

The invention claimed is:

1. A method of diffusion bonding of a lead zirconate-titanate (PZT) piezoelectric crystal to a metal wear plate for fabrication of a high temperature ultrasonic transducer comprising the steps of:
   i. depositing a first coating of a noble metal on a bonding surface of the PZT crystal;
   ii. depositing a second coating of the noble metal on a bonding surface of the metal wear plate;
   iii. bringing the bonding surfaces of the noble metal coated PZT crystal of step (i) and the bonding surface of the noble metal coated metal wear plate of step (ii) into contact with each other and heating under pressure ranging from 175 to 225 bar and at a temperature ranging from 270 to 400° C. to form a metallic bond to obtain a lead zirconate-titanate (PZT) piezoelectric crystal diffusion-bonded to the metal wear plate by a noble metal interlayer under vacuum;
   wherein, the metal wear plate is selected from nickel and nickel alloys; and
   wherein the metal interlayer is able to withstand a prolonged exposure to high temperature up to 250° C. and repeated thermal cycling.

2. The method as claimed in claim 1 wherein, the noble metal is selected from silver and gold.

3. The method as claimed in claim 1 wherein, the PZT crystal is coated with electrode before coating in step (i).

4. The method as claimed in claim 1 wherein, the bonding surface of metal wear plate is polished before coating in step (ii).

5. The method as claimed in claim 4 wherein, the bonding surface of metal wear plate at step (ii) is polished to mirror finish with planarity of ten micrometers and roughness of one micrometer.

6. The method as claimed in claim 1 wherein, the total thickness of the noble metal interlayer coating deposited on the bonding surface at step (i) and step (ii) ranges from 20 to 40 micrometers.

7. The method as claimed in claim 1 wherein, bonding time at step (iii) ranges from 45 to 75 minutes.

8. A high temperature ultrasonic transducer comprising:
   a. a lead zirconate-titanate (PZT) piezoelectric crystal with a pre-coated electrode;
   b. a metal wear plate;
   c. a noble metal interlayer;
   wherein the said lead zirconate-titanate (PZT) piezoelectric crystal with pre-coated electrode is diffusion-bonded to the metal wear plate by the noble metal interlayer by the method as claimed in claim 1;
   wherein, the metal wear plate is selected from nickel and nickel alloys; and
   wherein, the metal interlayer is able to withstand a prolonged exposure to high temperature up to 250° C. and repeated thermal cycling.

* * * * *